(12) United States Patent
Fujino et al.

(10) Patent No.: US 9,899,345 B2
(45) Date of Patent: Feb. 20, 2018

(54) ELECTRODE TERMINAL, SEMICONDUCTOR DEVICE FOR ELECTRICAL POWER, AND METHOD FOR MANUFACTURING SEMICONDUCTOR DEVICE FOR ELECTRICAL POWER

(71) Applicant: MITSUBISHI ELECTRIC CORPORATION, Chiyoda-ku, Tokyo (JP)

(72) Inventors: Junji Fujino, Tokyo (JP); Yutaka Yoneda, Tokyo (JP); Shohei Ogawa, Tokyo (JP); Soichi Sakamoto, Tokyo (JP); Mikio Ishihara, Tokyo (JP); Miho Nagai, Tokyo (JP)

(73) Assignee: MITSUBISHI ELECTRIC COOPERATION, Chiyoda-Ku, Tokyo (JP)

( * ) Notice: Subject to any disclaimer, the term of this patent is extended or adjusted under 35 U.S.C. 154(b) by 0 days.

(21) Appl. No.: 15/027,258

(22) PCT Filed: Jan. 23, 2015

(86) PCT No.: PCT/JP2015/051812
§ 371 (c)(1),
(2) Date: Apr. 5, 2016

(87) PCT Pub. No.: WO2015/111691
PCT Pub. Date: Jul. 30, 2015

(65) Prior Publication Data
US 2016/0293563 A1 Oct. 6, 2016

(30) Foreign Application Priority Data
Jan. 27, 2014 (JP) .................................. 2014-011967

(51) Int. Cl.
*H01L 23/495* (2006.01)
*H01L 23/00* (2006.01)
(Continued)

(52) U.S. Cl.
CPC .............. *H01L 24/45* (2013.01); *H01L 23/48* (2013.01); *H01L 23/49537* (2013.01);
(Continued)

(58) Field of Classification Search
CPC . H01L 23/49537; H01L 24/72; H01L 25/162; H01L 2224/48137; H01L 2224/72
See application file for complete search history.

(56) References Cited

U.S. PATENT DOCUMENTS

2003/0106924 A1 6/2003 Nobori et al.
2005/0148237 A1 7/2005 Nobori et al.
(Continued)

FOREIGN PATENT DOCUMENTS

JP 2560894 B2 12/1996
JP 2001-127100 A 5/2001
(Continued)

OTHER PUBLICATIONS

Office Action (Notification of Reasons for Refusal) dated Feb. 21, 2017, by the Japanese Patent Office in corresponding Japanese Patent Application No. 2015-559124 and a partial English translation thereof (11 pages).
(Continued)

*Primary Examiner* — Phat X Cao
(74) *Attorney, Agent, or Firm* — Buchanan Ingersoll & Rooney PC

(57) ABSTRACT

An electrode terminal includes: a first drawn-out part to be bonded to a main electrode; and a second drawn-out part that is formed of a plate member in a continuous fashion from one end portion to be positioned opposite to the main
(Continued)

electrode with a gap therebetween until another end portion to be connected to an external circuit, so that a portion in the first drawn-out part that is adjacent to a portion therein to be bonded to the main electrode, is bonded to an opposing surface to the main electrode in said one end portion; wherein the first drawn-out part is formed so that the portion to be bonded to the main electrode is away from the opposing surface; and wherein an opening portion corresponding to the main electrode is formed in the second drawn-out part.

20 Claims, 10 Drawing Sheets

(51) Int. Cl.
*H01L 25/16* (2006.01)
*H01L 23/48* (2006.01)
*H01L 25/07* (2006.01)
*H01L 25/18* (2006.01)

(52) U.S. Cl.
CPC .............. *H01L 24/36* (2013.01); *H01L 24/40* (2013.01); *H01L 24/48* (2013.01); *H01L 24/72* (2013.01); *H01L 24/81* (2013.01); *H01L 25/07* (2013.01); *H01L 25/162* (2013.01); *H01L 25/18* (2013.01); *H01L 2224/40095* (2013.01); *H01L 2224/40137* (2013.01); *H01L 2224/40139* (2013.01); *H01L 2224/45014* (2013.01); *H01L 2224/45124* (2013.01); *H01L 2224/4824* (2013.01); *H01L 2224/48472* (2013.01); *H01L 2224/73221* (2013.01); *H01L 2224/73265* (2013.01); *H01L 2224/85205* (2013.01); *H01L 2224/85214* (2013.01); *H01L 2224/85232* (2013.01); *H01L 2924/1033* (2013.01); *H01L 2924/10254* (2013.01); *H01L 2924/10272* (2013.01); *H01L 2924/1203* (2013.01); *H01L 2924/13055* (2013.01); *H01L 2924/13091* (2013.01); *H01L 2924/1579* (2013.01); *H01L 2924/181* (2013.01)

(56) References Cited

U.S. PATENT DOCUMENTS

| | | | |
|---|---|---|---|
| 2007/0290305 | A1 | 12/2007 | Oyama et al. |
| 2009/0008772 | A1* | 1/2009 | Apfelbacher ........... H01L 24/24 257/718 |
| 2010/0091464 | A1 | 4/2010 | Ohnishi et al. |
| 2010/0176505 | A1 | 7/2010 | Oyama et al. |
| 2011/0241198 | A1 | 10/2011 | Azuma |
| 2012/0256194 | A1* | 10/2012 | Yoshihara ............... H01L 24/32 257/77 |
| 2013/0134210 | A1 | 5/2013 | Muto et al. |
| 2014/0217156 | A1 | 8/2014 | Muto et al. |

FOREIGN PATENT DOCUMENTS

| | | | |
|---|---|---|---|
| JP | 2002-217363 | A | 8/2002 |
| JP | 2006-202885 | A | 8/2006 |
| JP | 2007-335719 | A | 12/2007 |
| JP | 2010-092918 | A | 4/2010 |
| JP | 2011-216822 | A | 10/2011 |
| JP | 2011-228387 | A | 11/2011 |
| JP | 2012-209444 | A | 10/2012 |
| JP | 2012-227320 | A | 11/2012 |
| JP | 2013-131735 | A | 7/2013 |
| JP | 2013-219139 | A | 10/2013 |
| WO | WO 2009/069308 | A1 | 6/2009 |
| WO | WO 2012/049893 | A1 | 4/2012 |

OTHER PUBLICATIONS

Office Action (Notification of Reasons for Refusal) dated Oct. 4, 2016, by the Japanese Patent Office in corresponding Japanese Patent Application No. 2015-559124 and English translation of the Office Action. (18 pages).
International Search Report (PCT/ISA/210) dated Apr. 21, 2015, by the Japanese Patent Office as the International Searching Authority for International Application No. PCT/JP2015/051812.
Written Opinion (PCT/ISA/237) dated Apr. 21, 2015, by the Japanese Patent Office as the International Searching Authority for International Application No. PCT/JP2015/051812.

* cited by examiner

ELECTRODE TERMINAL, SEMICONDUCTOR DEVICE FOR ELECTRICAL POWER, AND METHOD FOR MANUFACTURING SEMICONDUCTOR DEVICE FOR ELECTRICAL POWER

TECHNICAL FIELD

The present invention relates to an electrode terminal for connecting a main electrode on the front face side of a semiconductor element for electrical power with an external circuit, a semiconductor device for electrical power using the same, and a manufacturing method of that device.

BACKGROUND ART

For products all over from industrial apparatuses to home electronics/information terminals, semiconductor devices for electrical power are becoming widespread, and with respect to the semiconductor devices for electrical power to be installed in the home electronics, they are required to have high productivity and high reliability that allow them to deal with a wide variety of products as well as to be made compact and lightweight. At the same time, they are also required to have a package configuration that is applicable to silicon carbide (SiC) semiconductors which are highly likely to go mainstream in future because of being high in operation temperature and superior in efficiency.

In semiconductor devices for electrical power, because they deal with a high voltage and a large current, it has been general to wire a plurality of bonding wires each made of aluminum, etc. and being thick up to $\phi 0.5$ mm, for example, to a main electrode on the front face side of each of their semiconductor elements for electrical power, to thereby form an electric circuit. In contrast, for the purpose of improving productivity, etc., a semiconductor device for electrical power in which a wiring member formed of a metal plate such as a lead frame and the main electrode are bonded together by use of a solder, and a semiconductor device for electrical power in which a wide-width aluminum ribbon is ultrasonically bonded to the main electrode, are becoming widespread.

The aluminum ribbon has a larger cross section as compared with the bonding wire, thus making it easy to increase the current capacity while enhancing the productivity. However, when its length becomes long, heat generation becomes large like the bonding wire. For that reason, it is unable to be drawn out from the main electrode directly to the outside and thus, is required to be connected to an external terminal using a bus-bar made of copper, through a connection, with a ceramic board. This results in enlargement of the ceramic board and thus, the cost increases; in addition, the module becomes large as a whole, so that there is concern that thermal stress due to a difference in thermal expansion coefficient between the metal member and another also increases, thus adversely affecting reliability even in the bonded portion. Meanwhile, in the case of using a brazing material such as a solder, because the surface electrodes of semiconductor elements are mostly made of aluminum, it is necessary to metalize a surface of the main electrode with a metal bondable to the solder by copper or nickel plating processing or the like, resulting in complicated processes.

In this respect, there is proposed a method in which a clad ribbon formed in an arch shape is bonded by ultrasonic bonding onto the main electrode, and is bonded by soldering to an electrode plate (for example, Patent Document 1).

CITATION LIST

Patent Document

Patent Document 1: Japanese Patent Application Laid-open No. 2011-216822 (Paragraphs 0024 to 0032, FIG. 1 to FIG. 2)

SUMMARY OF THE INVENTION

Problems to be Solved by the Invention

According to this method, however, a step of supplying the solder is required and in addition, there is a problem that the bonded portion is covered by the electrode plate, so that it is difficult to inspect the bonded state. Further, in order to make the ribbon self-sustaining the arch shape at the time of solder bonding, its thickness is required to be thick, so that there is concern of damage to the semiconductor element for electrical power caused by the ultrasonic bonding or ribbon cutting. In particular, an impact is large when a highly-rigid material like the clad ribbon is cut, so that, in order to avoid the impact from being applied to the main electrode, it is necessary to cut the ribbon after through its connection to the board. Thus, even in this case, because an extra space for the connection of the clad ribbon is required on the board, the module becomes large, so that there is concern that the thermal stress increases to thereby degrade the reliability.

This invention has been made to solve the problems as described above, and an object thereof is to provide a semiconductor device for electrical power which is not required to metalize the main electrode, and which can deal with a large current and is highly reliable.

Means for Solving the Problems

An electrode terminal of the invention is an electrode terminal for connecting a main electrode of a semiconductor element for electrical power with external circuit, which is characterized by comprising: a first drawn-out part to be bonded to the main electrode; and a second drawn-out part that is formed of a plate member in a continuous fashion from one end portion to be positioned opposite to the main electrode with a gap therebetween until another end portion to be connected to the external circuit, so that a portion in the first drawn-out part that is adjacent to a portion therein to be bonded to the main electrode, is bonded to an opposing surface to the main electrode in said one end portion; wherein the first drawn-out part is formed so that the portion to be bonded to the main electrode is away from the opposing surface; and wherein an opening portion or a cutout portion corresponding to the main electrode is formed in the second drawn-out part.

Further, a semiconductor device for electrical power of the invention is characterized by comprising: a circuit board; a semiconductor element for electrical power bonded onto the circuit board; and the aforementioned electrode terminal being in a state where a main electrode of the semiconductor element for electrical power and the first drawn-out part are bonded together between their base materials.

Further, a method of manufacturing a semiconductor device for electrical power of the invention is a method of manufacturing the aforementioned semiconductor device for electrical power, which is characterized by comprising: a step of bonding the semiconductor element for electrical power onto the circuit board; a step of fixing the electrode terminal to the circuit board while positioning the opening portion and the main electrode to be matched to each other; and a step of inserting a jig through the opening portion to thereby bond the first drawn-out part with the main electrode by ultrasonic bonding or vacuum press-bonding.

Effect of the Invention

According to the electrode terminal of the invention, even if the mean electrode is not metalized, it is possible to form a main power line that can deal with a large current, while suppressing the impact applied to the semiconductor element, for electrical power without providing an extra space on the board, so that a semiconductor device for electrical power which can deal with a large current and is highly reliable can be provided.

MODES FOR CARRYING OUT THE INVENTION

Embodiment 1

Figure 1A:
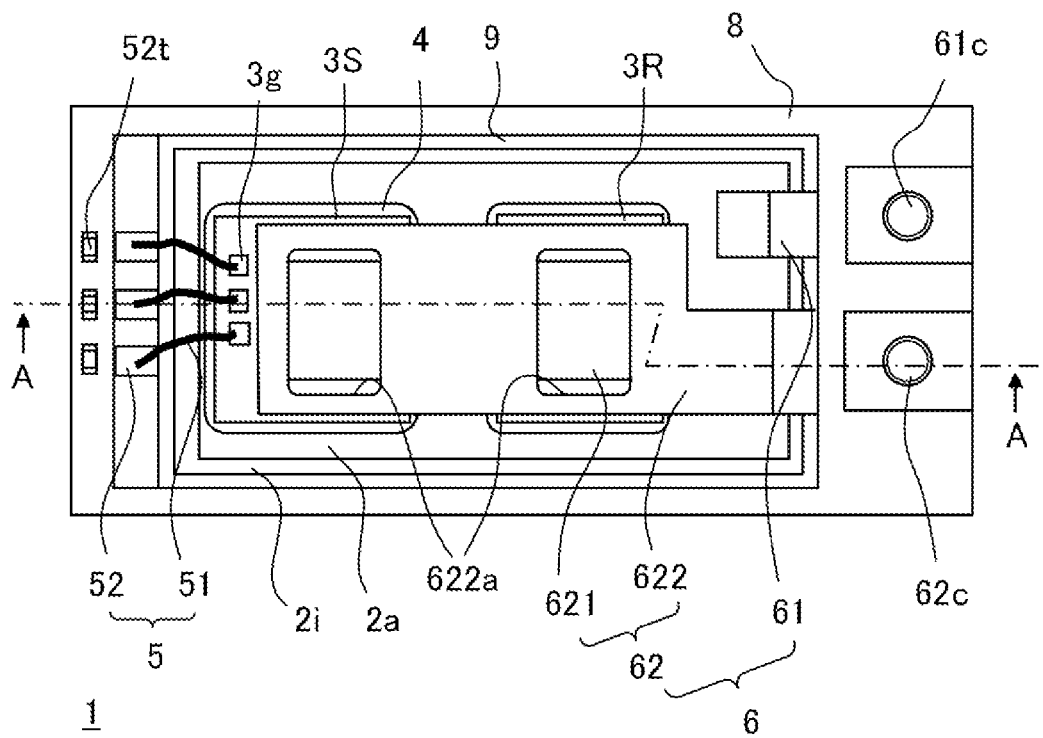
FIG. 1A and FIG. 1B are a plan view and a cross-sectional view respectively for illustrating configurations of an electrode terminal and a semiconductor device for electrical power using the same according to Embodiment 1 of the invention.
Figure 1B:
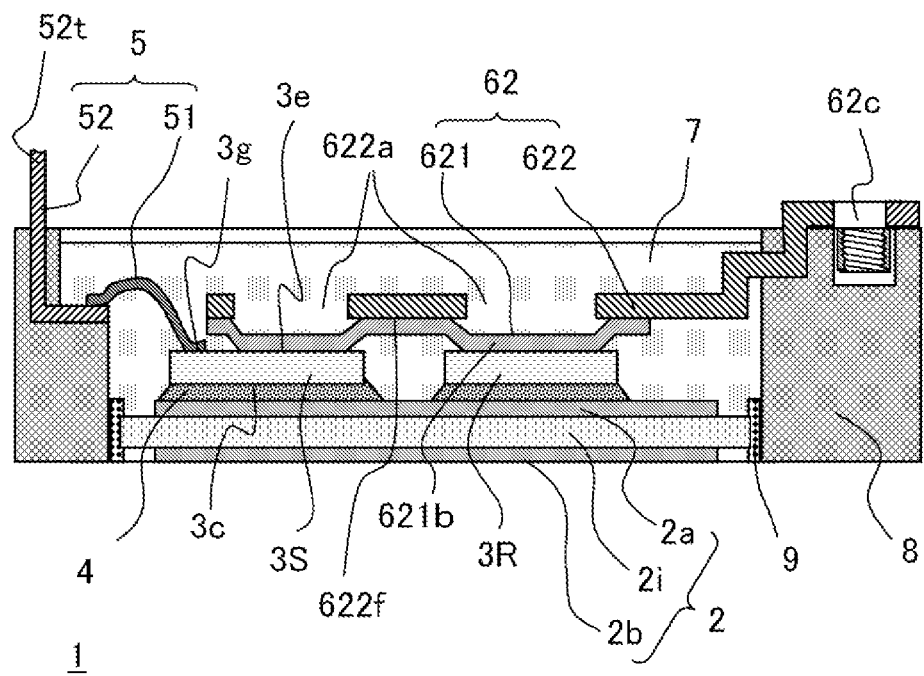
Figure 2:
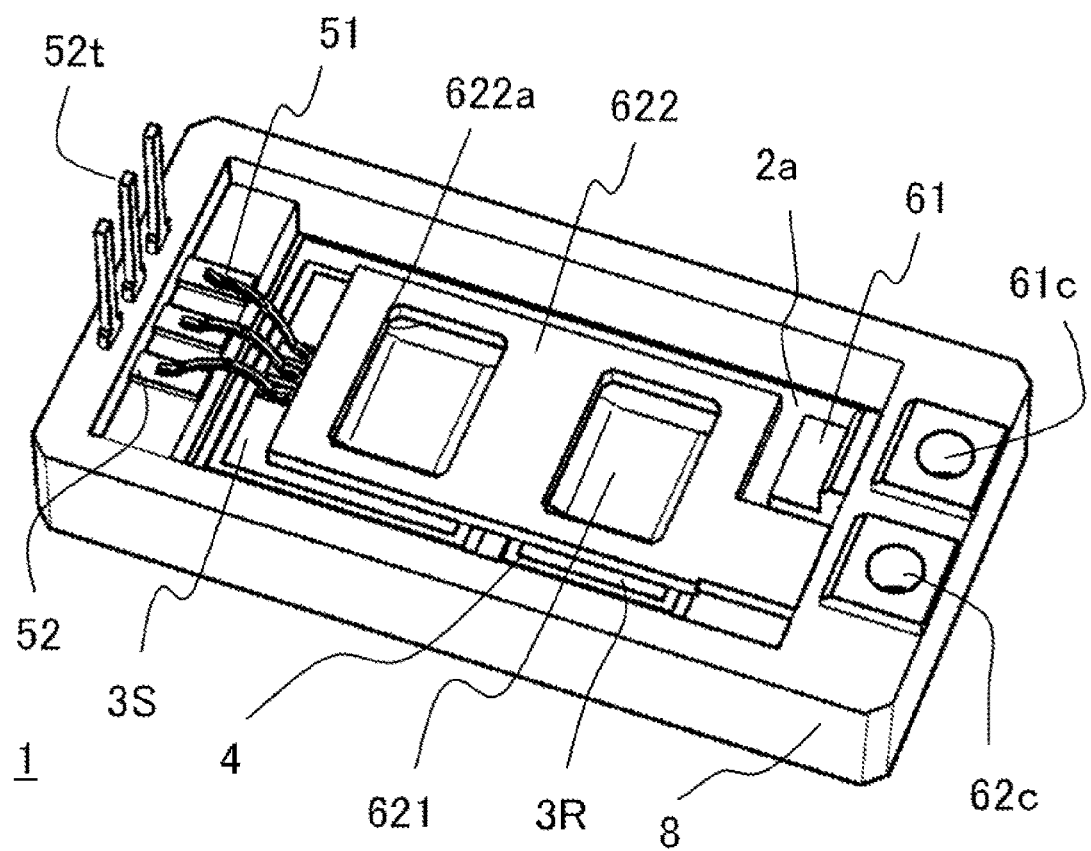
FIG. 2 is a perspective view for illustrating configurations of the electrode terminal and the semiconductor device for electrical power using the same according to Embodiment 1 of the invention.
Figure 3A:
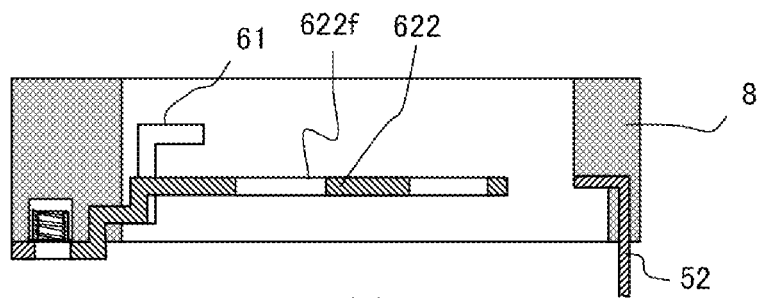
FIG. 3A, FIG. 3B, FIG. 3C and FIG. 3D are cross-sectional views, at respective steps, for illustrating a method of manufacturing the electrode terminal and the semiconductor device for electrical power using the same according to Embodiment 1 of the invention.
Figure 3B:
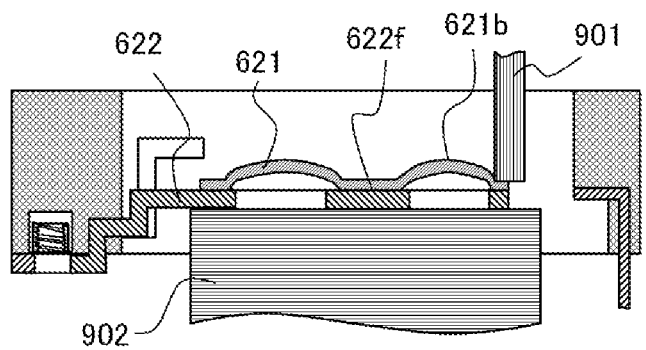
Figure 3C:
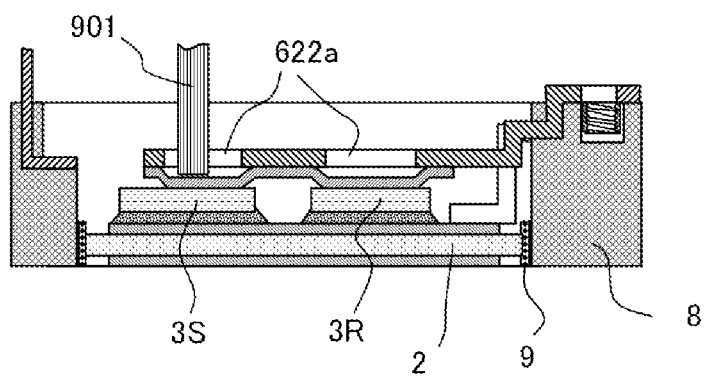
Figure 3D:
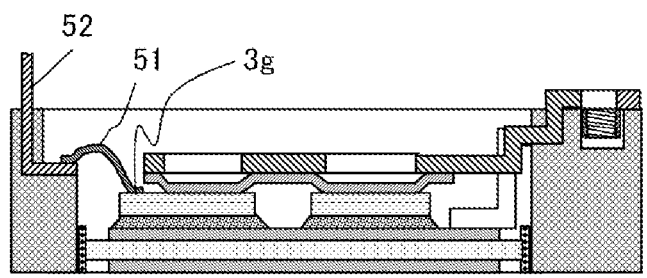
Figure 4A:
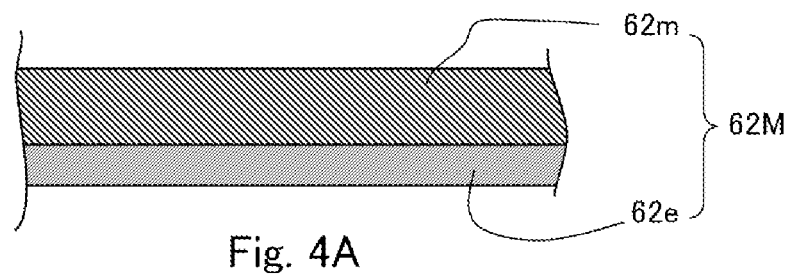
FIG. 4A, FIG. 4B, FIG. 4C and FIG. 4D are partial cross-sectional views, at respective steps, for illustrating a method of manufacturing an electrode terminal according to a modified example of Embodiment 1 of the invention.
Figure 4B:
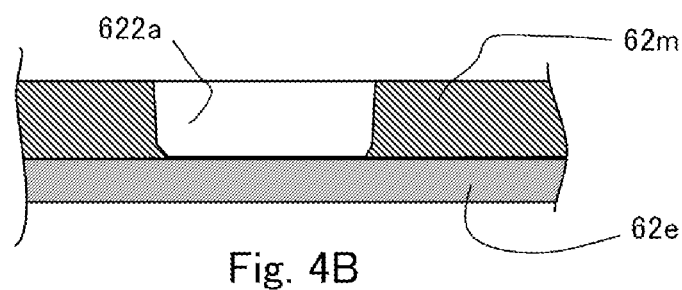
Figure 4C:
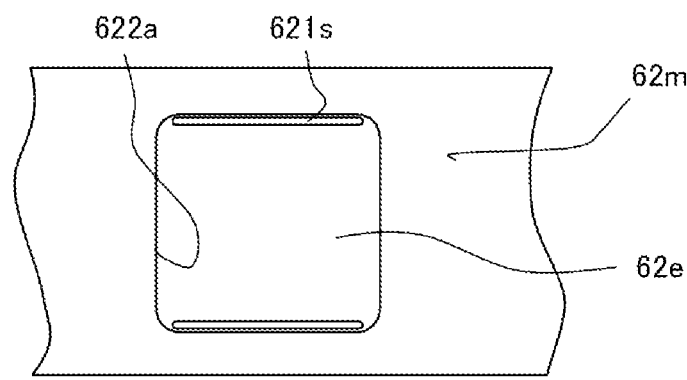
Figure 4D:
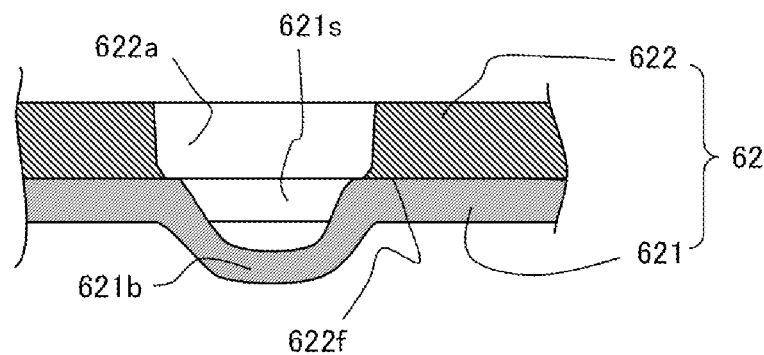

FIG. 1 to FIG. 3 are diagrams for illustrating configurations and a manufacturing method of an electrode terminal and a semiconductor device for electrical power using the same according to Embodiment 1 of the invention, in which shown at FIG. 1 (a) is a plan view of the semiconductor device for electrical power in a state where its sealing resin is removed, and at FIG. 1 (b) is a cross-sectional view of the semiconductor device for electrical power, a cut position of which corresponds to A-A line at FIG. 1 (a). FIG. 2 is a perspective view of the semiconductor device for electrical power in a state where its sealing resin is removed. Further, shown at FIG. 3 (a) to (d) are cross-sectional views, at respective steps, for illustrating a method of manufacturing the electrode terminal and the semiconductor device for electrical power using the same.

Figure 5:
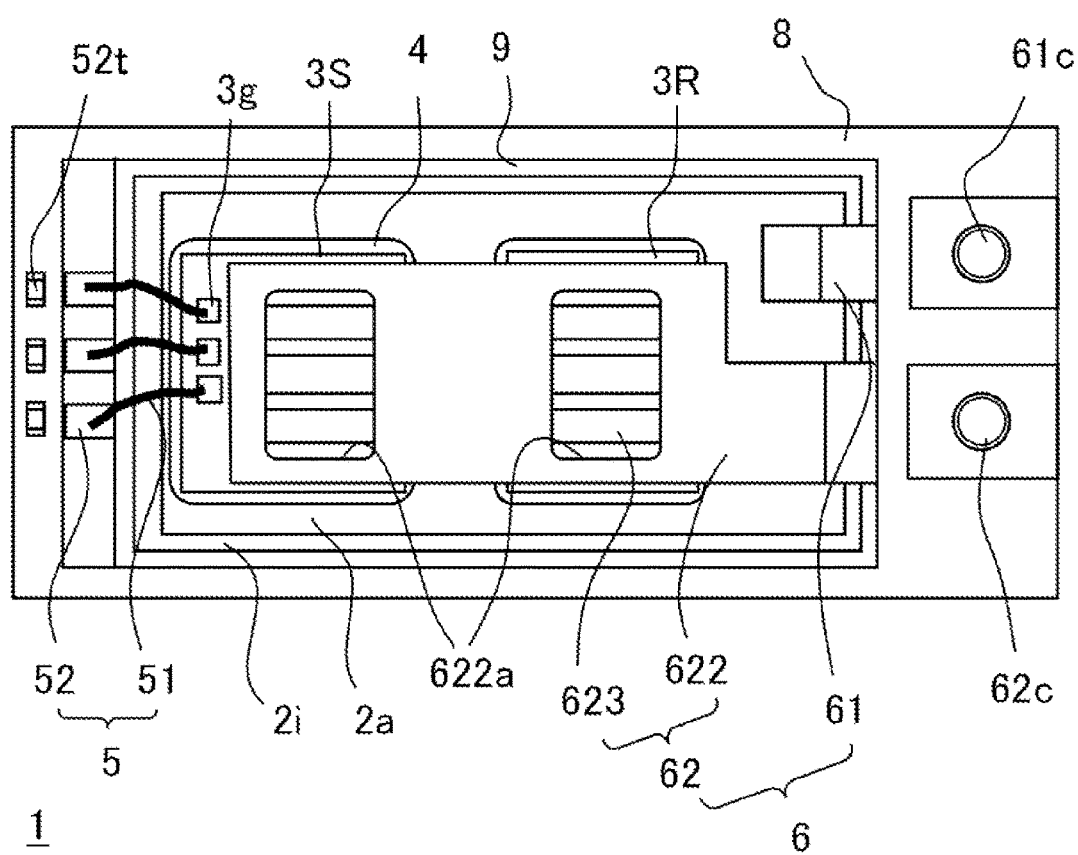
FIG. 5 is a plan view for illustrating configurations of an electrode terminal and a semiconductor device for electrical power using the same according to a modified example of Embodiment 1 of the invention.
Figure 6:
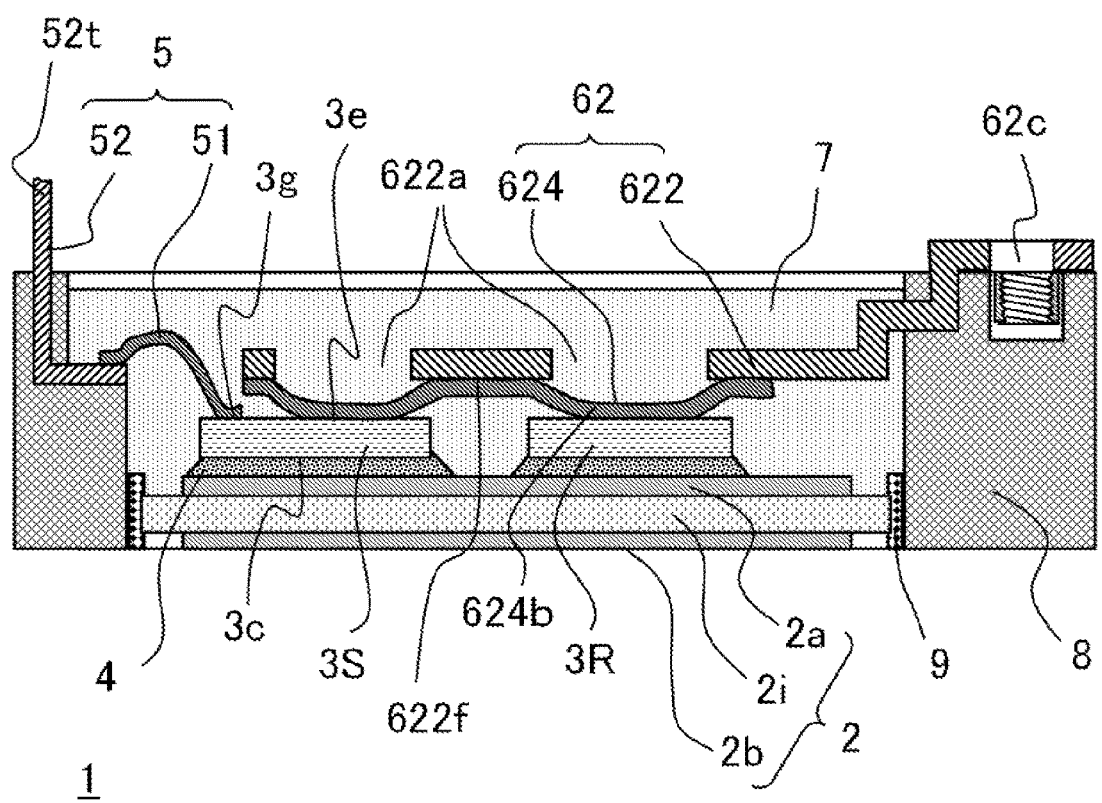
FIG. 6 is a cross-sectional view for illustrating configurations of an electrode terminal and a semiconductor device for electrical power using the same according to the modified example of Embodiment 1 of the invention.
Figure 7:
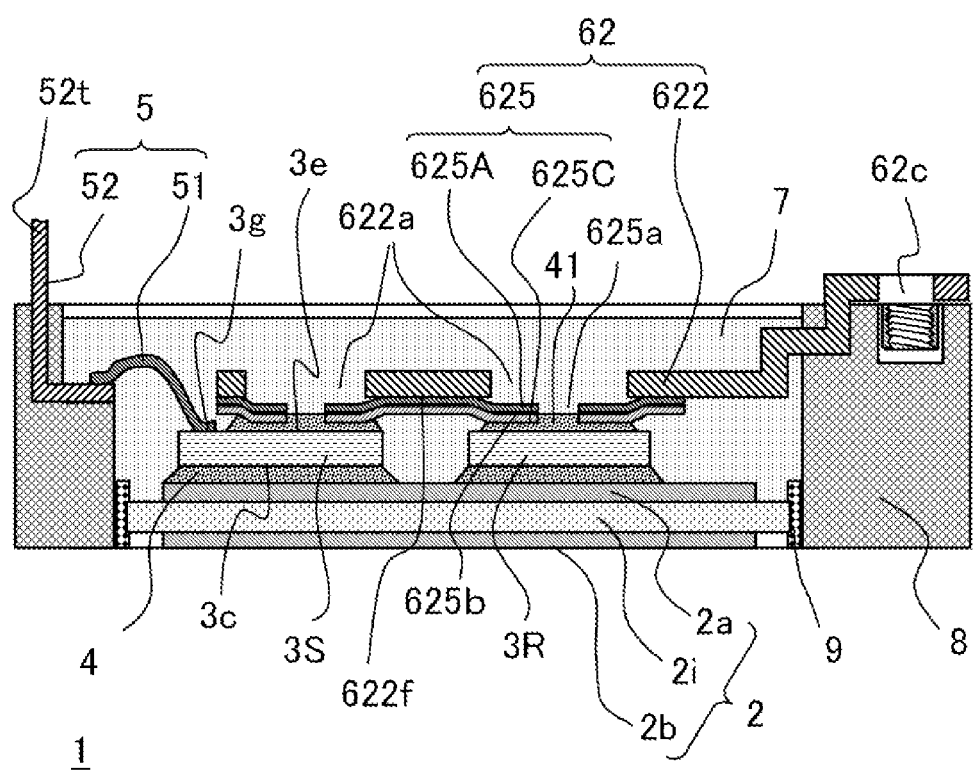
FIG. 7 is a cross-sectional view for illustrating configurations of an electrode terminal and a semiconductor device for electrical power using the same according to a modified example of Embodiment 1 of the invention.
Figure 8:
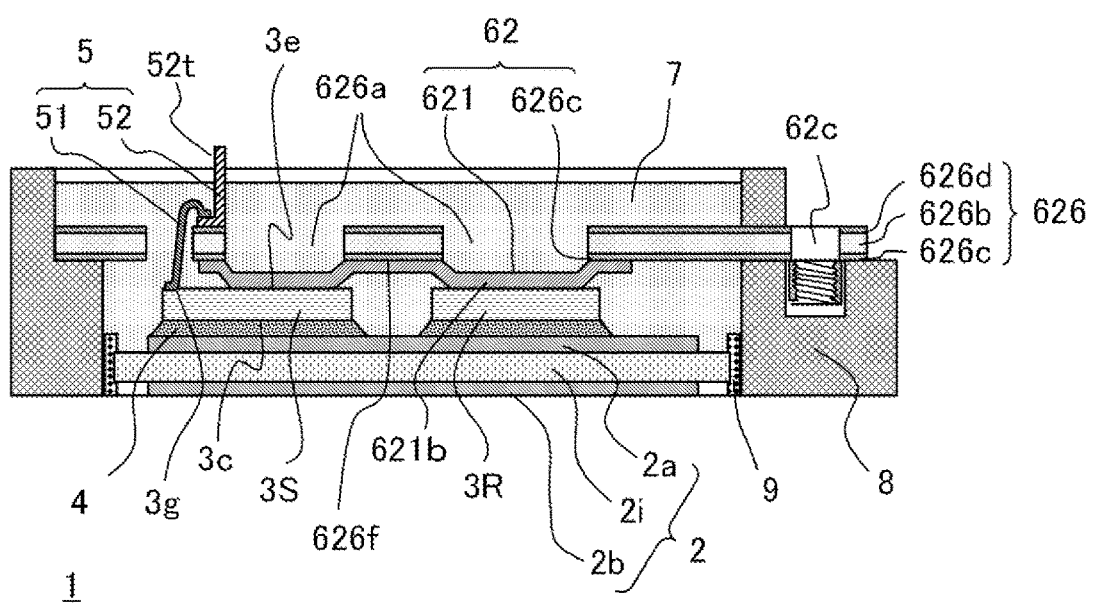
FIG. 8 is a plan view for illustrating configurations of an electrode terminal and a semiconductor device for electrical power using the same according to a modified example of Embodiment 1 of the invention.
Figure 9:
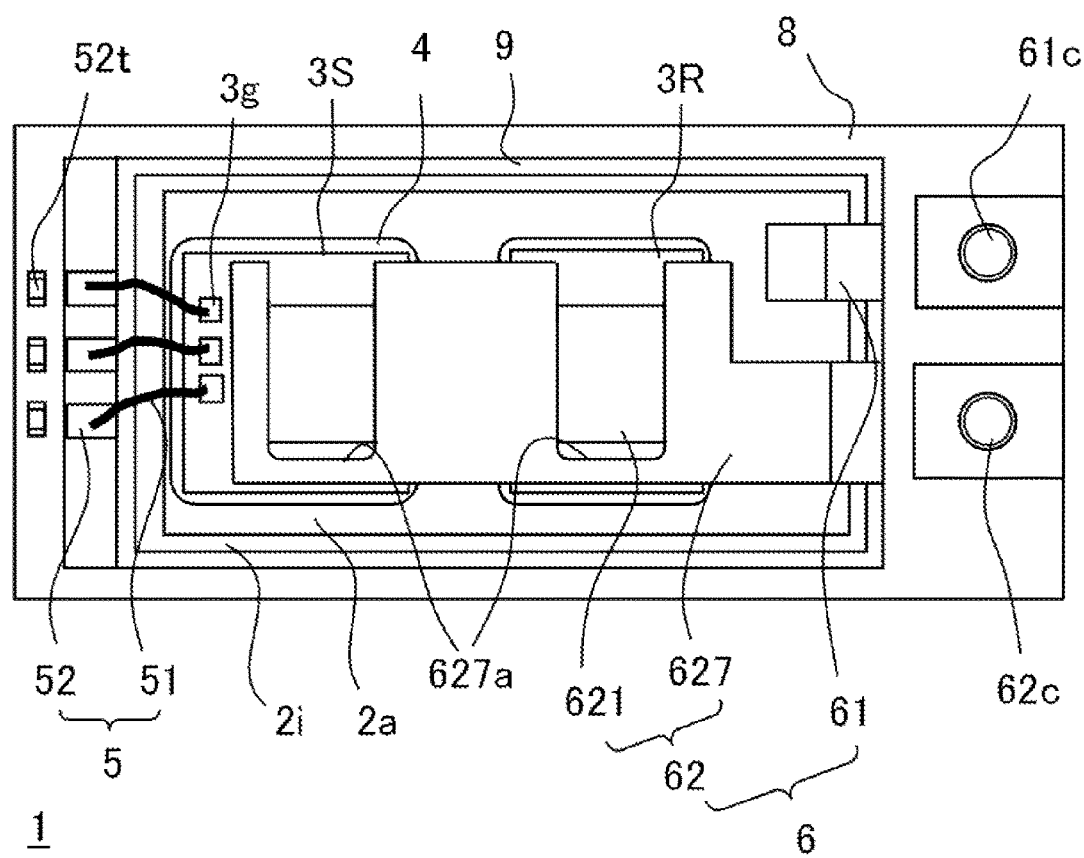
FIG. 9 is a cross-sectional view for illustrating configurations of another electrode terminal and a semiconductor device for electrical power using the same according to Embodiment 1 of the invention.

Further, shown at FIG. 4 (a) to (d) are partial cross-sectional views, at respective steps, for illustrating a method of manufacturing an electrode terminal according to a (first) modified example. Furthermore, FIG. 5 to FIG. 8 are diagrams for illustrating configurations of electrode terminals and semiconductor devices for electrical power according to (second to fifth) modified examples, respectively. FIG. 5 is a plan view for illustrating the electrode terminal and the semiconductor device for electrical power using the same according to the second modified example, in a state where its sealing resin is removed. FIG. 6 to FIG. 8 are cross-sectional views for illustrating configurations of the electrode terminals and the semiconductor devices for electrical power using the same according to the third to fifth modified example. FIG. 9 is a plan view for illustrating configurations of another electrode terminal and a semiconductor device for electrical power using the same according to Embodiment 1, in a state where its sealing resin is removed. Note that cut positions in the above cross-sectional views and partial cross-sectional views each correspond to A-A line at FIG. 1 (a).

In a semiconductor device for electrical power 1 according to Embodiment 1, as shown in FIG. 1 and FIG. 2, semiconductor elements for electrical power 3 are die-bonded (joined) to a conductive layer 2a of a ceramic board 2 that is a circuit board, using a solder 4 (Sn—Ag—Cu: melting point 219° C.)

As the ceramic board 2, a ceramic base member 2i of 50 mm×25 mm×0.635 mm thick, which is made of alumina ($Al_2O_3$) and on both sides of which copper conductive layers 2a, 2b each 0.4 mm thick are formed, is used. The semiconductor elements for electrical power 3 are elements using SiC that is a wide bandgap semiconductor material, and used here are an IGBT (insulated Gate Bipolar Transistor) 3S that is 0.25 mm thick and forms a rectangular-plate shape of 15 mm square, as a switching element, and a diode 3R that is 0.25 mm thick and forms a rectangular-plate shape of 13 mm×15 mm, as a rectifier element.

An electrode terminal 62 which is a feature of this invention is bonded to, among respective main electrodes of the semiconductor elements for electrical power 3, front-side main electrodes including an emitter electrode 3e of the IGBT 3S. Further, a lead terminal 61 made of a copper plate of 5 mm wide×0.7 mm thick is bonded onto the conductive layer 2a to which back-side electrodes including a collector electrode 3c of the IGBT 3S is bonded.

The ceramic board 2 is positioned and fixed inside a casing 8 made of a PPS (Poly Phenylene Sulfide) resin, using an adhesive agent 9 so that a gap between the casing and a portion of the ceramic base member 2*i* is sealed therewith. Note that the lead terminal 61, the electrode terminal 62 and signal terminals 52 are each formed by insert molding into the casing 8, and end portions 61*c*, 62*c* of the lead terminal 61 and the electrode terminal 62, that are exposed from an upper portion of the casing 8 (right-upper portion in the figure), are each provided as a screw terminal with a nut. Further, end portions 52*t* of the signal terminals 52, that are exposed from an upper portion of the casing 8 (left-upper portion in the figure), are each formed in a pin shape.

The electrode terminal 62 is configured with a second drawn-out part 622 of 0.7 mm thick made of copper, and a first drawn-out part 621 of 0.2 mm thick that is thinner than the second drawn-out part 622, made of aluminum and bonded onto one surface of the second drawn-out part 622. The second drawn-out part 622 is partly embedded in the casing 8 at the time of insert molding to be fixed thereto, and is placed so that, in the casing 8, its one end side is positioned opposite to the semiconductor elements for electrical power 3 (having an opposing surface 622*f*) with a gap therebetween. Further, its portions facing to the semiconductor elements for electrical power 3 have a width of 12 mm, in which opening portions 622*a* (each 10 mm widthwise×8 mm lengthwise) are formed in two places correspondingly to the respective main electrodes of the two semiconductor elements for electrical power 3 (3S, 3R).

The first drawn-out part 621 has a width of 8 mm and a total length of 35 mm, and is bonded to the second drawn-out part 622 at the widthwise center of the opposing surface 622*f* to the semiconductor elements for electrical power 3, along the longitudinal direction. On this occasion, portions across the opening portions 622*a* are each bent so as to be away from the opposing surface (plane) 622*f* and are bonded to the respective main electrodes of the semiconductor elements for electrical power 3 by ultrasonic bonding.

As a result, a main current circuit 6 between the semiconductor elements for electrical power 3 and an external circuit is formed by the lead terminal 61 and the electrode terminal 62. Further, a gate electrode 3*g* (1 mm×2 mm) of the IGBT 3S and the like are connected to the signal terminals 52 by bonding wires 51 to form a signal circuit 5. Further, the inside of the casing 8 is sealed in an insulating manner by filling a resin (sealing member 7) therein by direct potting and then curing it by heating.

Note that, in a state before formation of the sealing member 7, the first drawn-out part 621 is exposed through the opening portions 622*a*, so that the opening portions each serve as an insertion hole of a jig to be used when the first drawn-out part 621 is ultrasonically bonded to the main electrodes. For that reason, the aforementioned adhesion of the ceramic board 2 to the casing 8 is performed so that the positions of the opening portions 622*a* are matched to the positions of the main electrodes.

Next, description will be made about a method of manufacturing the semiconductor device for electrical power 1, including a method of manufacturing the electrode terminal 62, according to Embodiment 1.

First, as shown at FIG. 3 (*a*), the casing 8 which is integrated with the lead terminal 61, the signal terminals 52 and in addition, with the second drawn-out part 622 of the electrode terminal 62 is formed by insert molding. Then, as shown at FIG. 3 (*b*), the casing 8 is placed onto a base 902 in an upside-down state so that the opposing surface 622*f* faces upward. Using an ultrasonic bonding tool 901, bonding of the first drawn-out part 621 onto the second drawn-out part 622 is performed such that the first drawn-out part 621 can be seen through the opening portions 622*a* when viewed from the under side, to thereby form the electrode terminal 62.

Then, as shown at FIG. 3 (*c*), using the adhesive agent 9, the casing 8 is fixed to the ceramic board 2 on which the IGBT 3S and the diode 3R have been die-bonded by soldering. At this time, protrusion portions 621*b* in the first drawn-out part 621 that across the opening portions 622*a* and are placed away from the opposing surface 622*f* are in contact with the main electrodes of the IGBT 3S and the diode 3R. Then, in a state of the main electrodes facing upward, the ultrasonic bonding tool 901 is inserted in the opening portion 622*a* to thereby bond the first drawn-out part 621 individually to the main electrodes of the IGBT 3S and the diode 3R by ultrasonic bonding. Furthermore, because the lead terminal 61 and the conductive layer 2*a* on the ceramic board 2 are also in contact with each other, they are ultrasonically bonded to each other.

Then, as shown at FIG. 3 (*d*), bonding is made between the gate electrode 3*g* of the IGBT 3S and the signal electrode 52 using the bonding wire 51. Lastly, the resin (sealing member 7) is filled by direct potting, to establish insulative sealing. This completes the semiconductor device for electrical power 1 as shown at FIG. 1 (*b*).

The bonding of the first drawn-out part 621 that is an aluminum ribbon to the IGBT 3S and the diode 3R is not performed at once, but is performed at each of plural points using the ultrasonic bonding tool 901 whose pressing area is smaller than the area of the electrode. This makes it possible, even when an inclination occurs between the first drawn-out part 621 and the main electrode, to suppress their bonding quality from becoming unstable. Note that, like the second drawn-out part 622, the lead terminal 61 is thicker and also higher in rigidity than the first drawn-out part 621; however, since its object to be bonded thereto is not the main electrode but the conductive layer 2*a*, the power at the bonding can be increased without regard to the impact, and the bonding can be made in that manner.

Note that, for the bonding between the second drawn-out part 622 and the first drawn-out part 621, a case of using ultrasonic bonding has been shown; however, a similar effect is achieved by press bonding, spot welding, laser welding, soldering, adhesive bonding using an electroconductive adhesive agent, or the like. Further, a case has been shown where the bonding between the second drawn-out part 622 and the first drawn-out part 621 is performed after the second drawn-out part 622 is subjected to insert molding into the casing 8; however, before it is subjected to insert molding, the first drawn-out part 621 may be bonded to the second drawn-out part 622 to form the electrode terminal 62.

Further, for the bonding of the first drawn-out part 621 to the main electrode, although ultrasonic bonding has been exemplified, this is not limitative. The bonding method may be that in which a jig is put or laser light, etc, is radiated, onto a surface on the reverse side of the surface to be bonded, to cause bonding between their base materials, such as vacuum press-bonding, laser welding or the like. Thus, although the opening portions 622*a* are formed so that one opening corresponds to one main electrode, it is allowable to configure so that slits or plural openings correspond to that one electrode, so long as the aforementioned jig can be inserted or the laser light, etc. can be radiated therethrough.

Furthermore, for the second drawn-out part 622 of the electrode terminal 62 and the lead terminal 61, a case of using those made of copper (plate) has been shown; however, a similar effect can also be achieved by use of a plate member made of aluminum or a CIC (Copper-Invar Clad member). Further, a similar effect is also achieved even when they are in a flexible metal-foil shape, if they are made to have rigidity to a degree at which the first drawn-out part (ribbon) can be supported, for example, by being supported at both ends with respect to the casing.

Further, although a case has been shown where the terminal portions 61*c*, 62*c* are each provided as a screw terminal using a nut, a similar effect is achieved when they are each provided as a welding terminal with the elimination of a nut. As the material of the first drawn-out part 621, in order not to apply the impact to the main electrode at the time of bonding between their base materials, a material is desired that is lower in elastic modulus than that of the second drawn-out part 622; however, even when it is a copper ribbon, no problem arises when the apparatus capable of controlling impact is used. Further, as its shape, it is desired to be thinner (or narrower in diameter) than the second drawn-out part 622; however, it is not essential when the element, has no problem in its impact resistance.

Although a case has been shown where the IGBT 3S is used as a switching element, it may be a MOSFET (Metal Oxide Semiconductor Field Effect Transistor). Further, as the diode 3R, any of elements of a variety of types including an SBD (Schottky Barrier Diode) and the like is usable. In addition, the number of elements is not limited to two, and may be more than that or may be one.

Further, although a case has been shown where alumina is used as the ceramic base member 2*i*, a similar effect is also achieved when aluminum nitride, silicon nitride, or the like is used. Further, although a case has been shown where copper is used as the conductive layer 2*a*, a similar effect is also achieved when aluminum is used. Furthermore, although a case has been shown where the solder 4 is used for the die-bonding between the semiconductor element for electrical power 3 and the ceramic board 2, a similar effect is also achieved when an electroconductive adhesive agent in which silver fillers are dispersed in an epoxy resin, or low-temperature-cofired bonding material using silver nanoparticles, is used, in addition, such a bonding manner is also applicable to the bonding between the lead terminal 61 and the ceramic board 2.

Further, although a case has been shown where a PPS is used as the material of the casing 8, when an LCP (liquid-crystal polymer) is used, further improvement in heat resistance can be expected. Further, although a case has been shown where the sealing member 7 is formed by using a resin for direct potting, a similar effect is also achieved by sealing using a silicone gel.

First Modified Example (Manufacturing Method of Electrode Terminal)

In the above examples, there are shown cases where the second drawn-out part formed of a copperplate and the first drawn-out part formed of an aluminum ribbon, which were separate members, are bonded to each other to form the electrode terminal; however, this is not limitative. For example, the electrode terminal can be formed from a copper-aluminum clad member by subjecting it to etching processing and/or mechanical shaving to cause removal of copper only. In this modified example provided as a first modified example, description will be made about a method of machining the copper-aluminum clad member into the electrode terminal using etching processing.

As a material for forming the electrode terminal 62, a copper-aluminum clad member 62M is used in which a copper layer 62*m* of 0.7 mm thick and an aluminum layer 62*e* of 0.2 mm thick that is thinner than the copper layer 62*m*, are laminated as shown at FIG. 4 (*a*). First, as shown at FIG. 4 (*b*), a specified area of the copper layer 62*m* is removed by etching to form the opening portion 622*a*. Then, as shown at FIG. 4 (*c*), slits 621*s* each penetrating through the aluminum layer 62*e* are formed at both widthwise sides within a portion of the aluminum layer 62*e* exposed through the opening portion 622*a*. And then, a portion sandwiched between the silts 621*s* is placed away from the opposing surface 622*f* to thereby form the protrusion portion 621*b* as shown at FIG. 4 (*d*), and a portion on the side to be embedded in the casing 8 is subjected to bending or the like, so that the electrode terminal 62 is completed. Here, the copper layer 62*m* of 0.7 mm thick and the aluminum layer 62*e* of 0.2 mm thick are used as materials for forming the electrode terminal 62; however, there is no particular restriction on their thicknesses, and a similar effect is achieved if the above thicknesses of the copper and the aluminum are reversed.

Second Modified Example (Configuration of Electrode Terminal)

In the above examples, there are shown cases where the first drawn-out part is formed of a single aluminum ribbon; however, this is not limitative. In this modified example provided as a second modified example, as shown in FIG. 5, three aluminum ribbons each having a width of 2 mm and being bonded in parallel are used as a first drawn-out part 623. Accordingly, because the respective aluminum ribbons are bonded separately and respectively to the main electrode, even if the semiconductor element for electrical power 3 is die-bonded in an inclined manner to the ceramic board 2 or the aluminum ribbon is bonded in an inclined manner to the second drawn-out part 622, it becomes less likely to be affected by their relative inclination. Thus, a more highly reliable semiconductor device for electrical power 1 can be formed.

Third Modified Example (Configuration of Electrode Terminal)

In the above examples, there are shown cases where the first drawn-out part is formed of an aluminum ribbon(s); however, this is not limitative. In this modified example provided as a third modified example, as shown in FIG. 6, in place of the aluminum ribbon(s), stretched five aluminum wires each having $\phi$0.5 mm are provided as a first drawn-out part 624. This allows the bonded portion to be made more stable and thus, this becomes an effective implement in the case where the current capacity is relatively small relative to the size of the semiconductor element for electrical power 3.

Fourth Modified Example (Configuration of Electrode Terminal)

In the above examples, for the bonding of the first drawn-out part 621 to the main electrodes, ultrasonic bonding is exemplified; however, this is not limitative. For the bonding of the first drawn-out part to the main electrodes, a brazing material such as a solder may be used. For example, as shown in FIG. 7, a soldering material 41 bondable to the materials of the main electrode and the first drawn-out part can also be used. When the material of the main electrode is given as nickel or copper, and a first drawn-out part 625 formed of a copper ribbon or an aluminum-copper laminated clad ribbon is given as the first drawn-out part, this makes it possible to place a copper layer 625C that is capable of soldering on the side to be bonded using the soldering material 41, and to place an aluminum layer 625A that is easily bondable by ultrasonic bonding on the side to be bonded to the second drawn-out part 622, so that the respective connections can be established using a conventional tin-based soldering material. Further, the formation of an opening portion 625a for each bonding portion between the first drawn-out part 625 and the main electrode makes the soldering material to be easily supplied, so that it is possible to suppress a surplus solder from flowing out peripherally. As the soldering material, it is allowable to use a bonding material, such as an electroconductive adhesive agent, a silver nanopaste or the like.

Fifth Modified Example (Configuration of Electrode Terminal)

In the above examples, there are shown cases where the second drawn-out part 622 is used as being formed integrally with the casing 8 by insert molding; however, a glass-epoxy printed board may be used as the second drawn-out part. As shown in FIG. 8, a glass-epoxy printed board 626 is that in which surface conductive layers 626c, 626d comprised of copper are formed on the both surfaces of a glass-epoxy board 626b. A similar effect is achieved when the surface conductive layer 626c on the one side of the glass-epoxy printed board 626 is bonded to the first drawn-out part 621, and the drawn-out part 621 bonded to the second drawn-out part 626c is bonded to each main electrode using the ultrasonic bonding tool through each opening portion 626a formed in the glass-epoxy printed board 626. At this time, it becomes possible to simplify the casing by providing the signal terminal 52 on the surface conductive layer 626d placed on the side opposite to the surface conductive layer 626c in the glass-epoxy printed board 626, followed by connecting the signal terminal to the gate electrode 3g of the IGBT 3S using a bonding wire 51 to thereby form a signal circuit 5.

Note that in Embodiment 1 including the respective modified examples, there are shown cases where the protrusion portions 621b (also including 623b, 624b, 625b) corresponding respectively to the two opening portions 622a (also including 626a) are formed using a continuous ribbon or wire in order to establish continuity of the steps; however, this is not limitative. It is allowable to bond ribbons or wires individually at the respective opening portions 622a (also including 626a). Further, there are shown cases where the first drawn-out part 621 (also including 623, 624, 625) is formed so as to across the opening portions 622a along the current pathway; however, this is not limitative. For example, it may be formed so as to across the opening portions 622a (also including 626a) through both sides in the width direction of the second drawn-out part 622 (also including 626). Furthermore, the opening portions 622a (also including 626a) are formed in the second drawn-out part 622 (also including 626); this is not limitative. For example, as shown in FIG. 9, a similar effect is achieved even when cutout portions 627a, each like a form in which one end of the opening portion is made open, are formed in a second drawn-out part 627.

As described above, an electrode terminal according to Embodiment 1 is the electrode terminal 62 for electrically connecting the main electrode (for example, the emitter electrode 3e) on the front face side of the semiconductor element for electrical power 3 with an external circuit, which is configured to comprise: the first drawn-out part 621 (also including 623, 624, 625) to be bonded to the main electrode; and the second drawn-out part 622 (also including 626) that is formed of a plate member being higher in elastic modulus than the first drawn-out part 621 (also including 623, 624, 625) in a continuous fashion from one end portion to be positioned opposite to the main electrode with a gap therebetween until another end portion to be connected to the external circuit, so that a portion in the first drawn-out part 621 (also including 623, 524, 625) that is adjacent to a portion (protrusion portions 521b, 625b) therein to be bonded to the main electrode, is bonded to the opposing surface 622f (also including 626f) to the main electrode in said one end portion; wherein the first drawn-out part 621 (also including 623, 524, 625) is formed so that the portion (protrusion portions 621b, 525b) to be bonded to the main electrode is away from the opposing surface 622f (also including 626f); and wherein the opening portion 622a (also including 626a) corresponding to the main electrode is formed in the second drawn-out part 622 (also including 626). Thus, it is possible, without increasing the resistance of the electrode terminal in the current pathway from the main electrode to the external circuit, to bond between the base materials while suppressing the impact applied to the main electrode, so that, even though metallization, etc. is unnecessary, an extra space has not to be formed on the circuit board (ceramic board 2). Accordingly, the semiconductor device for electrical power which can deal with a large current and is highly reliable can be provided.

When, and because, the member that forms the first drawn-out part 621 (also including 623, 624, 625) is thinner than the member that forms the second drawn-out part 622, it is possible to bond between the base materials while suppressing the impact applied to the main electrode, more surely.

When, and because, the first drawn-out part 621 (also including 623) is formed of the aluminum ribbon, the electrode terminal 62 can be formed easily.

Even when the first drawn-out part 624 is formed of the aluminum wires, the electrode terminal 62 can be formed easily.

When, and because, the first drawn-out part 625 is formed of the clad ribbon, it is possible to make its bonding using a conventional soldering material.

When, and because, the second drawn-out part 626 is formed of the glass-epoxy printed board, it is possible to simplify the casing.

The semiconductor device for electrical power 1 according to Embodiment 1 comprises: the circuit board (ceramic board 2); the semiconductor element for electrical power 3 bonded onto the circuit board (ceramic board 2); and the aforementioned electrode terminal 62 being in a state where the main electrode (for example, the emitter electrode 3e) on the front face side of the semiconductor element for electrical power and the first drawn-out part 621 (also including 623, 624, 625) are bonded together between their base materials. Thus, the semiconductor device for electrical power which can deal with a large current and is highly reliable can be provided.

Further, the method of manufacturing the semiconductor device for electrical power according to Embodiment 1 is provided to include: a step of bonding the semiconductor element for electrical power 3 onto the circuit board (ceramic board 2); a step of fixing the electrode terminal 62 (or the casing 8 provided with the that terminal) to the circuit board (ceramic board 2) while positioning the opening portion 622a and the main electrode (for example, the emitter electrode 3e) to be matched to each other; and a step of inserting a jig (for example, the ultrasonic bonding tool 901) or radiating laser light, through the opening portion 622a (also including 626a), to thereby bond the first drawn-out part 621 (also including 623, 624, 625) with the main electrode by ultrasonic bonding, vacuum press-bonding or laser welding. Thus, the semiconductor device for electrical power which can deal with a large current and is highly reliable can be manufactured easily.

Embodiment 2

Figure 10A:
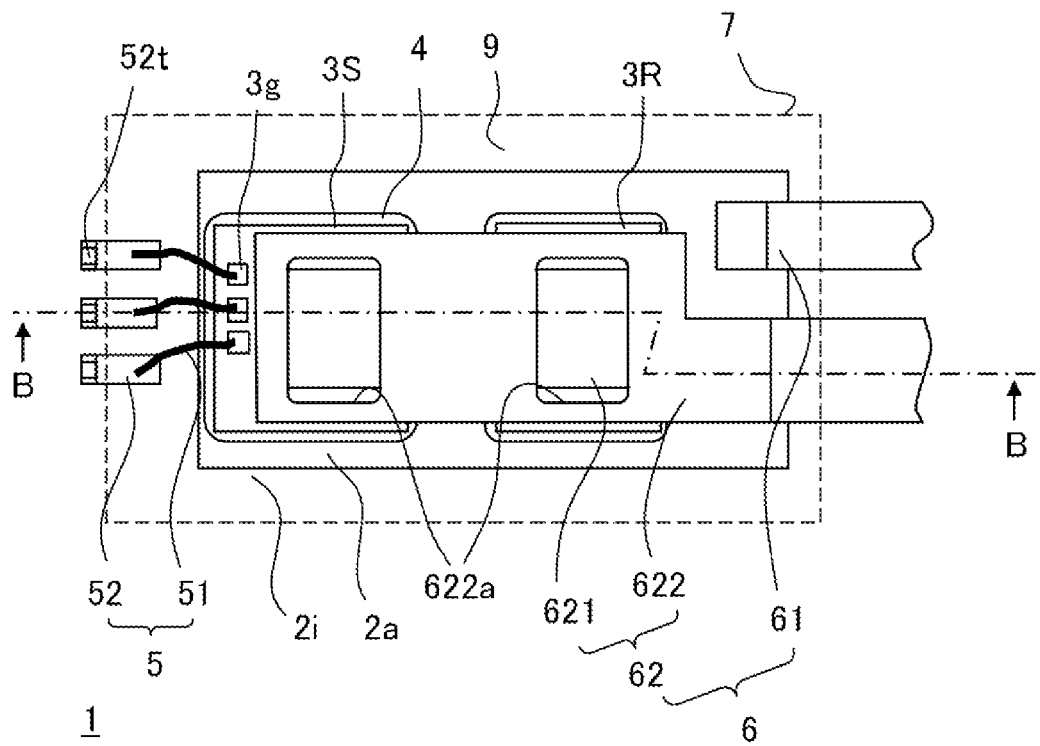
FIG. 10A and FIG. 10B are a plan view and a cross-sectional view respectively for illustrating configurations of an electrode terminal and a semiconductor device for electrical power using the same according to Embodiment 2 of the invention.
Figure 10B:
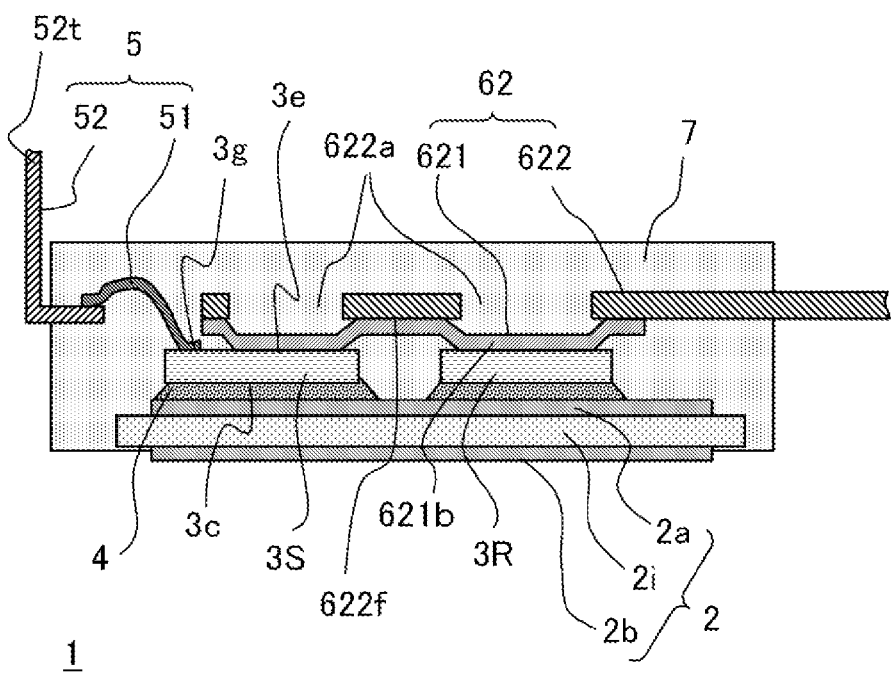

A semiconductor device for electrical power according to Embodiment 2 corresponds to the semiconductor device for electrical power described in Embodiment 1 provided that its sealing structure is modified so that a sealing member is formed by transfer molding. FIG. 10 is diagrams for illustrating configurations of an electrode terminal and a semiconductor device for electrical power using the same according to Embodiment 2 of the invention, in which shown at FIG. 10 (a) is a plan view in a state where the sealing resin is eliminated from the semiconductor device for electrical power, and shown at FIG. 10 (b) is a cross-sectional view of the semiconductor device for electrical power, a cut position of which corresponds to B-B line at FIG. 10 (a). In Embodiment 2, the structure of the first drawn-out part in the electrode terminal is similar to that which has been described in Embodiment 1 including the modified examples, so that its description will be omitted here. Further, in the figures the same reference numerals are given to the parts equivalent to those described in Embodiment 1, so that detailed description about such overlapping parts will be omitted here.

Also in the semiconductor device for electrical power 1 according to Embodiment 2, as shown in FIG. 10, the semiconductor elements for electrical power 3 are die-bonded (joined) to the conductive layer 2a of the ceramic board 2 that is a circuit board, using the solder 4 (Sn—Ag—Cu: melting point 219° C.)

As the ceramic board 2, the ceramic base member 2i of 50 mm×25 mm×0.635 mm thick, which is made of alumina ($Al_2O_3$) and on both sides of which the copper conductive layers 2a, 2b each 0.4 mm thick are formed, is used. The semiconductor elements for electrical power 3 are elements using SIC that is a wide bandgap semiconductor material, and used here are the IGBT 3S that is 0.25 mm thick and forms a rectangular-plate shape of 15 mm square, as a switching element, and the diode 3R that is 0.25 mm thick and forms a rectangular-plate shape of 13 mm×15 mm, as a rectifier element.

The second drawn-out part 622 (having a width of 12 mm at a portion to which the first drawn-out part is bonded), that is a part of the electrode terminal 62, and the lead terminal 61 (having a width of 5 mm) are provided together with the signal terminal 52 (1 mm×40 mm) each in a form of a lead frame of 0.7 mm thick. In the opposing surface 622f of the second drawn-out part 622, the opening portions 622a (each 10 mm widthwise×8 mm lengthwise) are formed in two places correspondingly to the respective main electrodes of the semiconductor elements for electrical power 3. Further, the aluminum ribbon having a width of 8 mm and a total length of 35 mm is bonded to the second drawn-out part 622 at a widthwise center of the opposing surface 622f along the longitudinal direction. On this occasion, portions across the opening portions 622a are each bent so as to be away from the opposing surface 622f, so that the first drawn-out part 621 is formed.

Then, in a state where the ceramic board 2 and the lead frames are positioned and fixed to each other, the respective main electrodes and the first drawn-out part 621 are bonded to each other by ultrasonic bonding, and the lead terminal 61 is bonded to the conductive layer 2a. This forms the main current circuit 6 between the semiconductor devices for electrical power 3 and the external circuit. Further, the gate electrode 3g (1 mm×2 mm) of the IGBT 3S and the like are connected to the signal terminals 52 by bonding wires 51 to form the signal circuit 5.

Then, in the ceramic board 2, its surface side where the semiconductor elements for electrical power 3 are mounted is sealed by transfer molding to thereby form a sealing member 7. Accordingly, the circuit parts including the semiconductor devices for electrical power are sealed in an insulated manner. Further, the electrode terminal 62, the lead terminal 61 and the signal terminals 52 are fully fixed by the sealing member 7 at their portions other than their end portions exposed outside.

Also in Embodiment 2, the bonding of the first drawn-out part 621 that is an aluminum ribbon (also including the first drawn-out parts 623, 624 in the modified examples shown in Embodiment 1) to the IGBT 3S and the diode 3R is not performed at once, but is performed at each of plural points using the ultrasonic bonding tool 901 whose pressing area is smaller than the area of the electrode. This makes it possible, even when an inclination occurs between the first drawn-out part 621 and the main electrode, to suppress their bonding quality from becoming unstable.

Further, for the bonding between the second drawn-out part 622 and the first drawn-out part 621, a case of using ultrasonic bonding has been shown; however, a similar effect is also achieved by press bonding, spot welding, laser welding, soldering, adhesive bonding using an electroconductive adhesive agent, or the like. Further, like the first modified example in Embodiment 1, the electrode terminal can be formed from a copper-aluminum clad member by subjecting it to etching processing and/or mechanical shaving to cause removal of copper only.

Further, for the bonding of the first drawn-out part 621 to the main electrode, the bonding method may also be that in which a jig is put or laser light, etc. is radiated, onto a surface on the reverse side of the surface to be bonded, to cause bonding between their base materials, such as vacuum press-bonding, laser welding or the like. Thus, also in Embodiment 2, although the opening portions 622a are formed so that one opening corresponds to one main electrode, it is allowable to configure so that slits or plural openings correspond to that one electrode, so long the aforementioned jig can be inserted or the laser light, etc. can be radiated therethrough. Further, for the second drawn-out part 622 of the electrode terminal 62 and the lead terminal 61, a case of using those made of copper (plate) has been shown; however, a similar effect can also be achieved by use of a plate member made of aluminum or a CIC (Copper-Invar Clad member).

Further, although a case has been shown where alumina is used as the ceramic base member 2i, a similar effect is also achieved when aluminum nitride, silicon nitride, or the like is used. Further, although a case has been shown where copper is used as the conductive layer 2a, a similar effect is also achieved when aluminum is used. Furthermore, although a case has been shown where the solder 4 is used for the die-bonding between the semiconductor elements for electrical power 3 and the ceramic board 2, a similar effect is also achieved when an electroconductive adhesive agent in which silver fillers are dispersed in an epoxy resin, or a low-temperature-cofired bonding material using silver nanoparticles, is used. In addition, such a bonding manner is also applicable to the bonding between the lead terminal 61 and the ceramic board 2.

Note that in the above respective embodiments, there are described about cases where SiC, that is a wide bandgap semiconductor material, is used for the semiconductor element for electrical power 3; however, as a matter of course, the invention can also be applied to usual element using silicon. Notwithstanding, a particularly remarkable effect emerges when a so-called wide bandgap semiconductor material is used that is wider in bandgap than silicon and is represented not only by silicon carbide, but also a gallium nitride (GaN) family material, diamond, or the like, in the case where an allowable current rate is high and a high-temperature operation is assumed. This is because the thickness (cross-sectional area) required for the electrode terminal 62 becomes thicker, so that the rigidity becomes higher and the displacement due to difference in linear expansion coefficient becomes larger because the operation temperature becomes higher. Thus, it is possible to more exert an effect that the semiconductor device for electrical power 1 which can deal with a large current and is highly reliable is achieved according to the configuration in which the first drawn-out part 621 (also including the first drawn-out part 623, 624 in the modified examples) to be subjected to ultrasonic bonding is combined with the second drawn-out part 622 thicker than the first drawn-out part 621, as described above. Namely, when the electrode terminal 62 according to the respective embodiments of the invention is used, it becomes possible to achieve a high-performance semiconductor device for electrical power 1 which takes advantage of the characteristic of a wide bandgap semiconductor.

It should be noted that unlimited combination of the respective embodiments and an appropriate modification/omission in the embodiments may be made in the present invention without departing from the scope of the invention.

DESCRIPTION OF REFERENCE NUMERALS and SIGNS

1: semiconductor device for electrical power, 2: ceramic board (circuit board), 2*a*, 2*b*: conductive layer, 2*i*: ceramic base member, 3: semiconductor element for electrical power, 4: solder (bonded portion), 5: signal circuit, 6: main current circuit, 7: sealing member, 8: casing, 9: adhesive agent, 61: lead terminal, 62: electrode terminal, 621, 623, 624, 625: first drawn-out part, 621*b*, 625*b*: protrusion portion, 622, 626: second drawn-out part, 622*a*, 626*a*: opening portion, 622*f*, 626*f*: opposing surface, 901: ultrasonic bonding tool (jig), 902: base.

The invention claimed is:

1. An electrode terminal for connecting a main electrode of a semiconductor element for electrical power with an external circuit, comprising:
   a first drawn-out part bonded to the main electrode; and
   a second drawn-out part that is formed of a plate member in a continuous fashion from one end portion positioned opposite to the main electrode with a gap therebetween until another end portion connected to the external circuit, so that a portion in the first drawn-out part that is adjacent to a portion therein bonded to the main electrode, is bonded to a widthwise center of a surface of the second drawn-out part opposing the main electrode in said one end portion;
   wherein the first drawn-out part is formed so that the portion bonded to the main electrode is spaced apart from the opposing surface of the second drawn-out part in plan view; and wherein an opening portion or a cutout portion corresponding to portions of the first drawn-out part bonded to the main electrode is formed in the second drawn-out part; and
   wherein the first drawn-out part is bonded to the second drawn-out part in a state in which a portion of the first drawn-out part is bent so as to be away from the second drawn-out part toward the semiconductor element for electrical power, and strides across the opening portion or the cutout portion.

2. The electrode terminal according to claim 1, wherein the second drawn-out part is formed of an insulation circuit board.

3. The electrode terminal according to claim 2, wherein the insulation circuit board is formed from a glass epoxy board.

4. The electrode terminal according to claim 1, wherein a member that forms the first drawn-out part has a thickness thinner than that of a member that forms the second drawn-out part.

5. The electrode terminal according to claim 1, wherein a member that forms the first drawn-out part has an elastic coefficient smaller than that of a member that forms the second drawn-out part.

6. The electrode terminal according to claim 1, wherein the first drawn-out part is formed of an aluminum ribbon.

7. The electrode terminal according to claim 1, wherein the first drawn-out part is formed of an aluminum wire.

8. The electrode terminal according to claim 1, wherein the first drawn-out part is formed of a clad ribbon in which two or more types of metals are laminated.

9. A semiconductor device for electrical power comprising:
   a circuit board;
   a semiconductor element for electrical power bonded onto the circuit board; and
   the electrode terminal according to claim 1, being in a state where a main electrode of the semiconductor element for electrical power and the first drawn-out part are bonded together between their base materials.

10. The semiconductor device for electrical power according to claim 9, wherein the semiconductor element for electrical power is formed of a wide bandgap semiconductor material.

11. The semiconductor device for electrical power according to claim 10, wherein the wide bandgap semiconductor material is silicon carbide, a gallium nitride family material or diamond.

12. A semiconductor device for electrical power comprising:
   a circuit board;
   a semiconductor element for electrical power bonded onto the circuit board; and
   the electrode terminal according to claim 8, being in a state where a main electrode of the semiconductor element for electrical power and the first drawn-out part are bonded together between their base materials.

13. The semiconductor device for electrical power according to claim 12, wherein the semiconductor element for electrical power is formed of a wide bandgap semiconductor material.

14. The semiconductor device for electrical power according to claim 13, wherein the wide bandgap semiconductor material is silicon carbide, a gallium nitride family material or diamond.

15. A method of manufacturing the semiconductor device for electrical power according to claim 9, comprising:
   a step of bonding the semiconductor element for electrical power onto the circuit board;
   a step of fixing the electrode terminal to the circuit board while positioning the opening portion and the main electrode to be matched to each other; and
   a step of inserting a jig through the opening portion to thereby bond the first drawn-out part with the main electrode by ultrasonic bonding or vacuum press-bonding.

16. A method of manufacturing the semiconductor device for electrical power according to claim 9, comprising:
   a step of bonding the semiconductor element for electrical power onto the circuit board;
   a step of fixing the electrode terminal to the circuit board while positioning the opening portion and the main electrode to be matched to each other; and
   a step of radiating laser light to the first drawn-out part through the opening portion to thereby bond the first drawn-out part with the main electrode by laser welding.

17. A method of manufacturing the semiconductor device for electrical power according to claim 12, comprising:
   a step of bonding the semiconductor element for electrical power onto the circuit board;
   a step of fixing the electrode terminal to the circuit board while positioning the opening portion and the main electrode to be matched to each other; and
   a step of supplying a brazing material through the opening portion to thereby bond the first drawn-out part with the main electrode by using the brazing material.

18. A method of manufacturing the semiconductor device for electrical power according to claim 10, comprising:
   a step of bonding the semiconductor element for electrical power onto the circuit board;
   a step of fixing the electrode terminal to the circuit board while positioning the opening portion and the main electrode to be matched to each other; and
   a step of inserting a jig through the opening portion to thereby bond the first drawn-out part with the main electrode by ultrasonic bonding or vacuum press-bonding.

19. A method of manufacturing the semiconductor device for electrical power according to claim 10, comprising:
   a step of bonding the semiconductor element for electrical power onto the circuit board;
   a step of fixing the electrode terminal to the circuit board while positioning the opening portion and the main electrode to be matched to each other; and
   a step of radiating laser light to the first drawn-out part through the opening portion to thereby bond the first drawn-out part with the main electrode by laser welding.

20. A method of manufacturing the semiconductor device for electrical power according to claim 13, comprising:
   a step of bonding the semiconductor element for electrical power onto the circuit board;
   a step of fixing the electrode terminal to the circuit board while positioning the opening portion and the main electrode to be matched to each other; and
   a step of supplying a brazing material through the opening portion to thereby bond the first drawn-out part with the main electrode by using the brazing material.

* * * * *